United States Patent [19]

Myers

[11] 4,240,088
[45] Dec. 16, 1980

[54] SEMICONDUCTOR HIGH-VOLTAGE SWITCH

[75] Inventor: William C. Myers, Burlington, Mass.

[73] Assignee: Semicon, Inc., Burlington, Mass.

[21] Appl. No.: 64,661

[22] Filed: Aug. 8, 1979

Related U.S. Application Data

[63] Continuation of Ser. No. 871,952, Jan. 24, 1978, abandoned, which is a continuation of Ser. No. 682,992, May 4, 1976, abandoned, which is a continuation of Ser. No. 475,721, Jun. 3, 1974, abandoned.

[51] Int. Cl.$^3$ ............................................. H01L 31/12
[52] U.S. Cl. ........................................ 357/19; 357/17; 357/30; 250/551
[58] Field of Search ........................... 357/19, 17, 30; 250/551

[56] References Cited

U.S. PATENT DOCUMENTS

| | | | |
|---|---|---|---|
| 3,240,943 | 3/1966 | White | 250/206 |
| 3,304,430 | 2/1967 | Biard | 250/217 |
| 3,304,431 | 2/1967 | Biard | 250/217 |
| 3,321,631 | 5/1967 | Biard | 250/209 |
| 3,413,480 | 11/1968 | Biard | 250/211 |
| 3,810,034 | 5/1974 | Brunsch | 330/59 |
| 3,845,318 | 10/1974 | Thillays | 250/551 |

OTHER PUBLICATIONS

Solid State Display and Optoelectronics Designer's Catalog, Jul. 1973, p. 8 and pp. 23, 24.

*Primary Examiner*—Martin H. Edlow
*Attorney, Agent, or Firm*—Cesari & Mc Kenna

[57] ABSTRACT

A high voltage, fast acting electronic switch is formed from a reverse-biased PIN diode having an exposed intrinsic region, together with a controllable optical source for emitting radiation directly onto the intrinsic region to switch the diode from its non-conducting state to its conducting state.

9 Claims, 3 Drawing Figures

SEMICONDUCTOR HIGH-VOLTAGE SWITCH

This is a continuation of application Ser. No. 871,952 filed Jan. 24, 1978, now abandoned, which is a continuation of application Ser. No. 682,992 filed May 4, 1976, now abandoned, which is in turn a continuation of application Ser. No. 475,721 filed June 3, 1974, now abandoned.

BACKGROUND OF THE INVENTION

A. Field of the Invention

The invention relates to electronic switches and, more particularly, to high voltage, fast acting semiconductor electronic switches.

B. Prior Art

Numerous devices are presently available for voltage switching applications. For example, devices such as siliconcontrolled rectifiers are capable of switching from a high impedance state to a low impedance state on application of a control signal thereto. However, the switching speed of such devices is limited. Further, once the SCR is turned on, the polarity of the voltage it is switching must be reversed before it can be turned off again. Thus, it is unsuitable for DC switching.

Transistors have also been used as voltage switching devices, but these also suffer numerous disadvantages. To begin with, the breakdown voltage of transistors of moderate cost is limited. Thus, when higher switching voltages are sought from a transistor, several transistors are generally connected in series. This increases the size and cost of the switch, and also places stringent limitations on the driving circuitry, which further increases the cost of the overall switch.

PIN diodes are semiconductor devices having an intrinsic region of semiconductor material (generally silicon or germanium) interposed between regions of P-type and N-type semiconductor material, respectively. Typically, the P and N regions are heavily doped, while the intrinsic (I) region is very lightly doped and is only approximately intrinsic. The equivalent resistance of the diode arises mainly from the intrinsic region, and is a function of the forward current through the diode; its depletion-layer capacitance is essentially constant over a wide range of reverse bias voltage. Because of these characteristics, the PIN diode is frequently used as a variable attenuator, particularly in high frequency (microwave) circuits. It is also commonly used as a switch at microwave frequencies by varying the reverse bias voltage across it; a common switching application is in a microwave ring modulator.

The PIN diode has heretofore been used as a photodiode, that is, a device which generates a current in accordance with the light flux incident on it. Typically, the light flux is incident on the P or N region, and traverses these narrow regions, to the intrinsic region where it creates hole-electron pairs. It has also been suggested that the PIN diode may be used as a photovoltaic device, that is, a voltage generator, by stacking a number of them in series and illuminating the intrinsic region to thereby generate a voltage across the diode. However, it has not heretofore been recognized that the photoresponsive nature of this diode, together with its possession of a substantial region of intrinsic material, make it eminently suitable for use as a high speed, high voltage, linear switch.

BRIEF SUMMARY OF THE INVENTION

A. Objects of the Invention

Accordingly, it is an object of the invention to provide an improved switching device.

A further object of the invention is to provide an improved electronic switch.

Still a further object of the invention is to provide a linear semiconductor switch.

Yet another object of the invention is to provide a high voltage switch.

Still another object of the invention is to provide a high voltage, high speed electronic switch.

A further object of the invention is to provide an efficient, comparatively inexpensive, high voltage semiconductor switch.

B. Brief Description of the Invention

In accordance with the present invention, I form a high speed, high voltage linear switch from a PIN diode having an exposed intrinsic region of substantial length (to sustain breakdown voltages of from hundreds to thousands of volts) together with an optical driving element such as a light-emitting diode (LED) positioned immediately adjacent the intrinsic region to direct illumination thereon. A driving current applied to the LED generates a corresponding current of lesser amplitude through the PIN. The switch is linear, that is, the amplitude of the PIN current is directly proportional to that of the driving current.

In particular, I use a PIN diode of generally rectangular configuration with axially aligned P, I, and N regions so that the intrinsic (I) region, is laterally exposed. I place the diode in a reversely poled direction in series with a voltage source and a load, and switch the source to the load by means of a light source positioned immediately adjacent the exposed intrinsic region of the diode. In the absence of light incident on the intrinsic material, the diode is capable of sustaining a reverse voltage of a magnitude proportional to the width of the intrinsic region. Thus, an intrinsic region of silicon $\frac{1}{4}$ mm. long can withstand reverse voltages up to about 2000 volts with leakage currents no greater than nanoamperes. When, however, the intrinsic region is irradiated from an optical source, the reverse current through the diode dramatically increases. When this occurs, the voltage source is effectively coupled directly to the load via the PIN diode with acts as a controlled current source.

In addition to its ability to withstand high reverse voltages, the PIN diode can be switched very quickly from its "off" (non-conducting, high-resistance) state to its "on" (conducting, low-resistance) state far more quickly than conventional SCR's. Thus, the PIN diode switch of the present invention is clearly a superior, high voltage, fast switch. Further, the current flow through the switch is a direct and substantially linear function of the driving current applied to the LED and the switch is thus infinitely variable between its extreme (fully off and fully on) conditions.

The switch of the present invention may be used in either AC or DC circuitry. For DC use, a suitable switching circuit comprises a single PIN diode connected in series with a voltage source and a load, and oriented with normally reverse polarity to the source. For AC use, a pair of PIN diodes are connected backto-back (i.e., in series reverse) and these in turn are connected in series with a voltage source and a load.

DETAILED DESCRIPTION OF THE INVENTION

The foregoing and other and further objects and features of the invention will be more readily understood from the following detailed description of the invention when taken in conjunction with the accompanying drawing in which.

Figure 1:
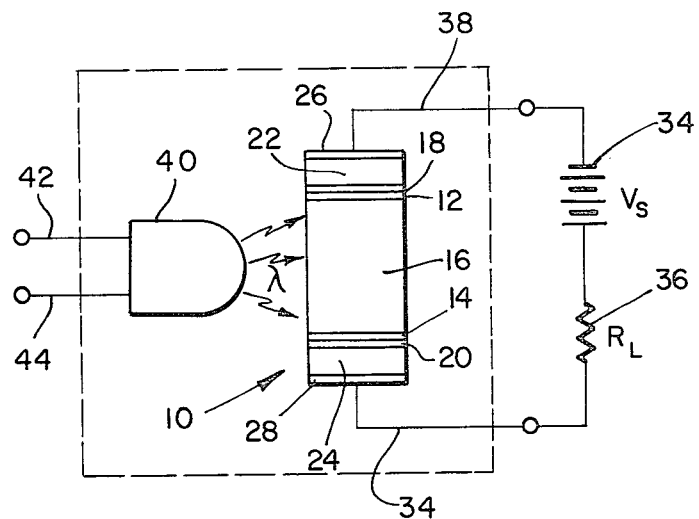
FIG. 1 is a diagrammatic view of a switch in accordance with the present invention for switching DC voltages.

In FIG. 1, a PIN diode 10 has a P region 12, an N region 14, and an intrinsic or I region 16, respectively. Metallic layers 18 and 20 separate the P and N regions from associated heavily doped regions 22 and 24 respectively. These regions shield the active P and N regions from contamination; because of their heavy doping, they offer little resistance to current flow. Further, they allow the diode to assume a convenient size for handling and packaging. They are terminated in metallic layers 26 and 28, respectively to which leads 30 and 32, respectively, are attached for connection to an external circuit.

Leads 30 and 32 connect diode 10 in series with a voltage source 34, illustratively shown as a battery, and a load 36, illustratively shown as a resistor. The diode is oriented (poled) such that it is normally reverse biased by the voltage source 34. With this orientation, the diode 10 is normally non-conducting and thus essentially zero current (neglecting the small reverse saturation current) flows through the load. The reverse bias also widens the depletion regions at the P-I and I-N junctions and increases the electric field existing across the intrinsic region due to the exposed immobile ions in the depletion regions. This field extends from the N region into the P region and limits the diffusion of majority carriers into the intrinsic region during equilibrium.

Positioned adjacent the diode 10 is a radiation source 40. The source 40 may advantageously comprise a light-emitting diode (LED); such a diode is of small size and can provide sufficient light flux to cause the desired switching. The source 40 is positioned to irradiate the intrinsic region 16 directly, and has control terminals 42 and 44. When a voltage is applied across these terminals, the source irradiates the intrinsic region 16 and thereby generates hole-electron pairs. The number of such pairs so generated is a direct function of the intensity of the incident radiation. The electric field existing across the intrinsic region sweeps the resultant charge carriers out of the intrinsic region into the P and N regions, respectively, the holes being swept into the P regions and the electrons being swept into the N region. This constitutes a reverse current, and its magnitude is thus a direct function of the intensity of the incident radiation from the source 80. The source is thus connected to the load while this current flows.

Figure 2:
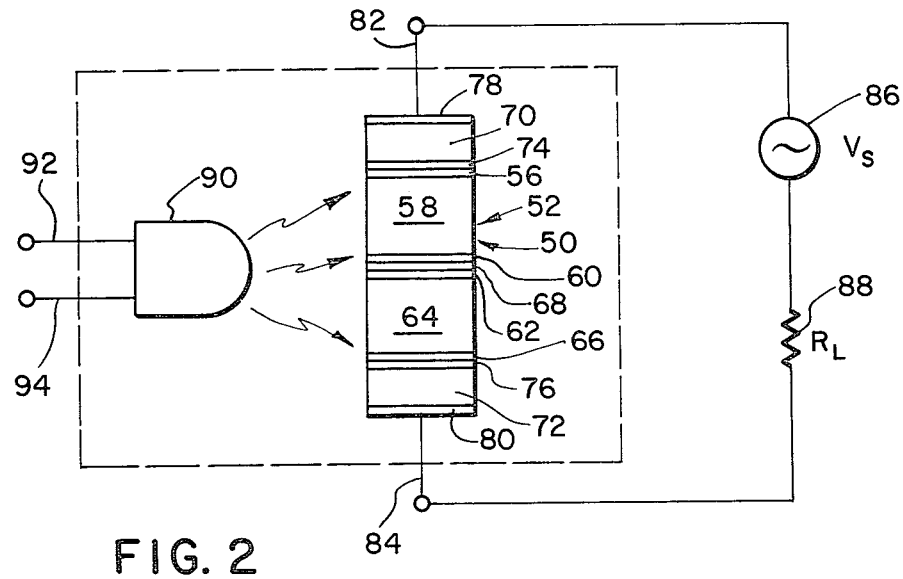
FIG. 2 is a diagrammatic view of a switch in accordance with the present invention for switching AC voltages.

FIG. 2 shows a high voltage, high speed switch in accordance with the present invention that is useful in connection with switching an AC source. The PIN diode 50 of FIG. 2 comprises first and second "back-to-back" diodes 52 and 54, respectively. Diode 52 has a thin, heavily doped P region 56; a thick, lightly doped, approximately intrinsic, region 58; and a thin, heavily doped N region 60. Similarly, diode 54 has a thin, heavily doped N region 62; a thick, lightly doped, approximately intrinsic, region 64; and a thin, heavily doped P region 56. A thin metallic layer 68 separates the P region 60 and the N region 62 and also serves to join the diodes 52 and 66 in a single bar.

The diode structure is terminated by heavily doped regions 70 and 72, at the opposite ends of the diode, respectively. These regions are separated from the adjacent regions 56 and 66, by metallic layers 74 and 76, respectively. The regions 70 and 72 are terminated in thin metallic layers 78 and 80 to which leads 82 and 84, respectively, are connected for connection to the external circuit. The diode is connected in series with voltage source 86 and a load 88. The intrinsic regions 58 and 64 are irradiated from a source 90 having leads 92, 94 to which a driving signal is applied.

The operation of the switch of FIG. 2 is similar to that of the switch of FIG. 1, with slight differences due to the fact that an AC source is used in FIG. 2 instead of the DC source of FIG. 1. Regardless of the instantaneous polarity of the source 86 in FIG. 2, one of the diodes 58 and 64 in FIG. 2 is reversed biased. Accordingly, in the absence of a driving signal applied to the source 90, only a small reverse current will flow through the composite diode 50 to the external circuit. Thus, the source 86 is effectively decoupled from the load 88. However, when a driving signal is applied to the source 90, the radiation emitted by this source generates hole-electron pairs in the intrinsic region 58 and 64 and these create a current flow proportional to the intensity of the incident radiation; this current flows through the load and thus effectively couples the source 90 to the load 88.

Figure 3:
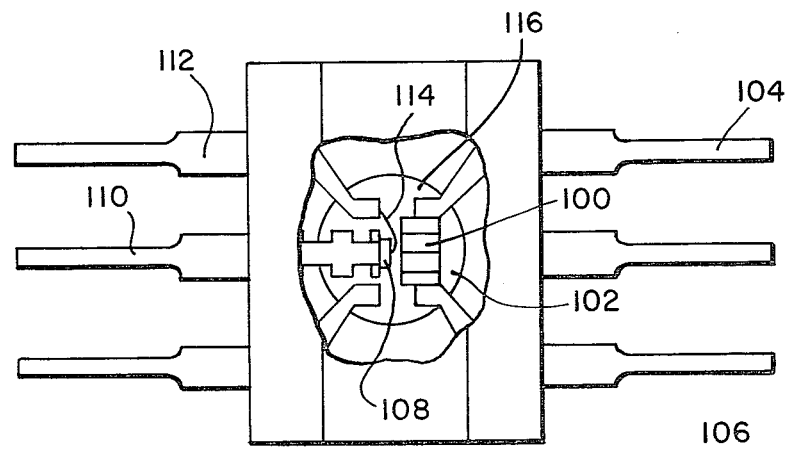
FIG. 3 is a plan view of a commercial embodiment of the switch of FIG. 2.

FIG. 3 is a plan view of a packaged version of a switch of the type shown in FIG. 2. A composite PIN diode 100, consisting of a pair of back-to-back PIN diodes, is mounted on a substrate 102 and has a pair of leads 104, 106 connected to the respective end faces of the diode 100. Directly opposite one of the side faces of the diode 100 is a light emitting diode 108 connected between a first lead 110 and a second lead 112 via a lead 114. The diodes 100 and 108 are encapsulated within a hardenable compound 116 having high transmissivity within the radiation band of the source 108. Thus, light from the source 108 is coupled to the diode 100 with very little attenuation. An opaque housing 118 surrounds the potted components and hermetically seals them. In use, the switch control source is connected to the terminals 110, 112, while the source voltage and the load it is to drive are connected in series with the terminals 104, 106. The operation is then as set forth in connection with FIG. 2.

A typical switch I have constructed in accordance with the present invention is of the type shown in FIGS. 2 and 3 and has a composite (back-to-back diodes) PIN diode 0.065 inches in length and 0.04 inches square in cross section. The metallic layers corresponding to the layers 68, 74, 76, 78 and 80 are each 0.01 inches in length. The P and N regions corresponding to the regions 56, 66 and 60, 62 respectively, are each 0.0015 inches thick and the intrinsic regions corresponding to the regions 58 and 64 are each 0.0070 inches thick. The doped conductor regions corresponding to the regions 22 and 24 are each 0.02 inches thick. The basic semiconductor utilized is silicon; the P region is doped with phosphorous at a surface concentration of about $10^{22}/cm^3$; the N region is doped with boron at a surface concentration of $10^{22}/cm^3$; and the intrinsic region is lightly doped with boron to render its resistivity on the order of 50–100 ohm-cm. The overall diode has a leakage current of the order ten nanoamperes ($10^{-8}$ amps) at a reverse bias voltage of 1,000 volts. When driven from a gallium arsenide light emitting diode, the overall switch (comprising the driving diode and the PIN diode) has a current gain of approximately $10^{-3}$ over a range of driving currents from milliamperes to amperes. At the higher driving levels, presently available light-emitting diodes dictate that the control signal be pulsed. Under the above conditions of high source voltage and low "on" current, the PIN diode switch, in combination with the source voltage, effectively behaves as a current source whose magnitude is controlled by the driving signal applied to the light emitting diode.

From the foregoing, it will be seen that I have provided an improved high voltage, high speed electronic switch. The switch is formed from compact, light weight, relatively inexpensive components, namely, one or more PIN diodes and an exciting source such as a light emitting diode. Due to the nature of the PIN diode, the length of the intrinsic region may be readily adjusted to accommodate itself to a wide range of reverse voltages. Due to the optical driving, the control circuit is effectively decoupled from the power circuit and thus special isolation techniques are obviated.

Numerous changes may be made in the foregoing without departing from either the spirit or scope of the invention. For example, although the maximum reverse voltage the PIN diode can withstand can be increased by increasing the length of the I (intrinsic) region of the diode, the same result can be accomplished by placing two or more PIN diodes in series. Preferably these are formed integrally in a single bar of the type shown in FIG. 2. For AC voltages, of course, one would use two or more series-connected diodes poled in a reverse direction in series with two or more series-connected diodes poled in the opposite direction. Again, all of these may be formed in a single bar. In either case, of course, the driving source should illuminate each intrinsic region.

One may also use additional driving sources for controlling the switch. Thus, although the invention has been illustrated in connection with a single driving source, one may use a driving source for each intrinsic region of the PIN diode or for each group of intrinsic regions of the diodes. Further, one may utilize a variety of optical driving sources in place of the specific source illustrated by the drawings. For example, in applications requiring fast current or voltage pulses, one may advantageously drive the switch from a flash tube, that is, a device (typically of the gaseous discharge type) which produces a high intensity optical pulse of short duration. Other types of optical driving sources, both within and outside of the visible spectrum, may be used in connection with the invention.

Numerous other changes may be made in the invention without departing from either the spirit or the scope thereof and it should be understood that the foregoing description and drawings are illustrative only and are not to be taken in a limiting sense, the scope of the invention being defined in particularly in the claims.

Having illustrated and described a preferred embodiment of the invention, I claim:

1. A high voltage, high speed switch comprising: A. at least one PIN diode connected in a reverse-bias direction between a voltage source and a load, said diode including at least one essentially planar major lateral surface, a P-conductivity type region, an N-conductivity type region, an essentially intrinsic I region between the P region and the N region and a planar P-I junction and a planar N-I junction oriented substantially normal to said lateral surface, the intrinsic region of said diode being exposed at said lateral surface and being of sufficient dimension between the P and N regions to sustain reverse voltages of about one thousand volts or more; and B. an optical source positioned immediately adjacent said lateral surface of said diode
   (1) oriented, when energized, to direct radiation onto the exposed intrinsic region of said diode through said lateral surface to thereby generate charge carriers in sufficient quantity to couple said source to said load, and
   (2) connected for energization separately from said PIN diode.

2. An optically controlled high voltage switch comprising, in combination:

A. a first semiconductor device interposed in a reverse bias direction between a power source and a load to be connected to said source, said first semiconductor device having a substantially doped P region, a substantially doped N region, and a substantially intrinsic region, said intrinsic region being located between and separated from said P and N regions by a P-I junction and an N-I junction, respectively, said first semiconductor device further including an essentially planar major lateral surface oriented substantially normal to said P-I and N-I junctions, said intrinsic region being exposed at said lateral surface and being of sufficient dimension between the P and N regions to sustain reverse voltages of about one thousand volts or more; and B. a variable intensity light source for emitting light in response to an applied control signal, the light emitted by said light source having an intensity that varies in response to variations in said control signal, said light source being positioned immediately adjacent said lateral surface of said first semiconductor device so that the light emitted by said light source directs radiation onto the exposed intrinsic region through said lateral surface, said light source being connected for energization from a control source independent of said power source.

3. A device according to claim 2 wherein said variable intensity light source comprises a second semiconductor device forming a light emitting diode, wherein said light emitting diode is responsive to said control signal to emit light, said control signal comprising a current passing through said light emitting diode in the forward direction, wherein the intensity of said emitted light is related to the magnitude of said forward current.

4. A switch according to claim 1 in which
A. said PIN diode is in the form of an elongated bar having the P and the N regions at its opposite ends, the P and N regions
   (1) being of relatively small dimension in the direction of the length of said bar,
   (2) being separated by the intrinsic region by said P-I and N-I junctions, said intrinsic region having a substantially greater dimension in the direction of the length of said bar than each of said P region and said N region, and, (3) having metallized contact regions at least partially obscuring the end faces thereof for connection to an external circuit, and B. the entire dimension of said intrinsic region in the direction of the length of said bar is exposed at said lateral surface for illumination directly by said optical source.

5. A switch according to claim 4 in which said optical source comprises a light-emitting diode positioned immediately adjacent said intrinsic region for illumination thereof in response to a control signal.

6. A switch according to claim 5 in which said source directs illumination onto said intrinsic region from a direction transverse to the length of the bar.

7. A switch according to claim 6 in which said light-emitting diode and said PIN diode are jointly encapsulated in a light-transmitting potting compound.

8. A high voltage, high speed switch comprising:

A. first and second PIN diodes connected back to back in a reverse-bias direction between a voltage source and a load, each of said diodes including at least one essentially planar major lateral surface, a P-conductivity type region, an N-conductivity type region, an essentially intrinsic I region between the P region and the N region and a planar P-I junction and a planar N-I junction oriented substantially normal to said lateral surface, the intrinsic region of said diode being exposed at said lateral surface and being of sufficient dimension between the P and N regions to sustain reverse voltages of hundreds of volts or more; and B. an optical source adjacent said lateral surfaces of said diodes
 (1) oriented, when energized, to direct radiation directly onto the exposed intrinsic region of both said diodes through said lateral surfaces to thereby generate charge carriers in sufficient quantity to couple said source to said load, and
 (2) connected for energization separately from said PIN diodes; and C. in which said voltage source comprises an AC voltage source.

9. A switch according to claim 8 in which said first and second PIN diodes are joined together in the form of a single elongated bar having first and second intrinsic regions of extended dimension in the direction of the length of said bar, each intrinsic region having at least one side face thereof directly exposed for irradiation by said optical source, said intrinsic regions being interposed between A. first and second pairs of P and N regions of substantially smaller dimension in the direction of the length of said bar than said intrinsic region and in face-to-face contact with said intrinsic region, and forming therewith said first and second PIN diodes connected in series reverse, and B. a region of conductive material covering a face of each of said P and N region opposite the face in contact with the intrinsic region for connecting said diode in series with said source and said load.

* * * * *